United States Patent [19]
Cipher et al.

[11] 3,976,943
[45] Aug. 24, 1976

[54] PHASE LOCK LOOP AM/FM RECEIVER

[75] Inventors: John A. Cipher, Garland; Malcolm M. Lorang, McKinney, both of Tex.

[73] Assignee: Texas Instruments Incorporated, Dallas, Tex.

[22] Filed: Aug. 19, 1974

[21] Appl. No.: 498,493

[52] U.S. Cl. ............................. 325/317; 325/329; 325/349; 329/122; 329/132
[51] Int. Cl.$^2$ ......................................... H03D 3/02
[58] Field of Search .................... 325/60, 315–317, 325/346, 349, 351, 419, 444; 329/50, 100, 122–124, 1, 2, 130, 132, 133, 135; 332/1, 17, 23 A

[56] References Cited
UNITED STATES PATENTS

| | | | |
|---|---|---|---|
| 3,800,226 | 3/1974 | Close | 325/315 |
| 3,829,778 | 8/1974 | Amaroso | 325/17 |
| 3,864,635 | 2/1975 | Ewanus | 325/65 |

OTHER PUBLICATIONS

Exar Integrated Systems Inc., *Monolithic Phase-Locked Loop*, pp. 1–8, 1972.

*Primary Examiner*—Benedict V. Safourek
*Attorney, Agent, or Firm*—Harold Levine; James T. Comfort; James O. Dixon

[57] ABSTRACT

A received radio signal is demodulated by applying it to a coherent demodulator loop for detection of a modulated input signal. The loop has a variable gain control capability. A gain control voltage dependent upon variations of amplitude of the input signal is then generated and is applied to control the gain within the loop.

In one aspect, a received radio signal is demodulated by multiplying the signal with a local oscillator signal to produce two product voltages the first of which reflects exponential (EM frequency or phase) variations and may reflect amplitude variations in said radio signal and the second of which reflects only amplitude variations. The amplitude of the first product voltage is modified in dependence upon amplitude variations in the second product voltage whereby the modified first product voltage is an audio output voltage representative exclusively of exponential modulation of the radio signal and the second product voltage is an audio output voltage representative of amplitude modulation of the radio signal.

10 Claims, 8 Drawing Figures

PHASE LOCK LOOP AM/FM RECEIVER

This invention relates to a demodulator for an exponentially and/or amplitude modulated signal which may be executed as a monolithic semiconductor circuit structure, and more particularly to a system in which signal leveling is accomplished inside a coherent demodulator loop so that amplitude variations of the input signal will not degrade demodulation of the coherent detector and in which an AM, FM or PM signal may readily be exacted. Exponential modulation is also known as angle modulation.

The present invention is directed to a circuit which may be implemented on a single monolithic semiconductor circuit structure and which is of extremely low cost. AM/FM tuners, for example, have heretofore been constructed in a wide variety of circuit arrangements and with a correspondingly wide range of performance achievements. High fidelity systems for home music centers and the like often are extremely expensive and are highly complex. On the other end of the spectrum are relatively inexpensive portable AM/FM receivers. In the latter receivers, the performance must be reliable but must be executed at minimal cost.

In integrated circuits achievement of high gain at high frequencies are costly and therefore is to be avoided where possible.

The present invention permits demodulation in a signal channel characterized by minimal gain.

The present invention leads to low cost demodulation and does not require transformers or tuning coils outside of a preselect circuit. A manually operable switch may be used to select either AM or exponential modulation reception. In the exponential signal leveling is accomplished by AGC inside the loop so that amplitude variations of the input signal will not affect loop parameters.

The present invention is directed to an exponential modulation system unique in and of itself. It is further directed to an AM/EM system wherein the AM signal in the AM mode may be readily extracted utilizing system components also employed in the EM mode. It may be also employed as a chroma demodulator in a color TV set.

In accordance with the present invention, a modulated signal processor is provided wherein a coherent demodulator loop is employed for detection of a modulated input signal. The loop has a variable gain control capability. Means are provided to generate a gain control voltage dependent upon all variations in amplitude of the input signal with circuit means for applying the gain control voltage to the loop to control the gain within the loop in accordance with the gain control voltage. In accordance with a more specific aspect and in accordance with one embodiment thereof, there is provided a pair of mixers to which an EM signal is applied. An automatic gain controlled amplifier is connected to receive the output of a first of the mixers and to supply an output to a voltage controlled oscillator which is connected to track the frequency of the output of the amplifier. A circuit connects the output of the oscillator to the first mixer for multiplication of the EM signal and connects a quadrature phased output of the oscillator to a second mixer for multiplication with the EM signal. A circuit then applies the output of the second mixer as an AGC voltage to the amplifier whereby the output from the automatic gain controlled amplifier, or first mixer, is the demodulated FM signal.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

Figure 1:
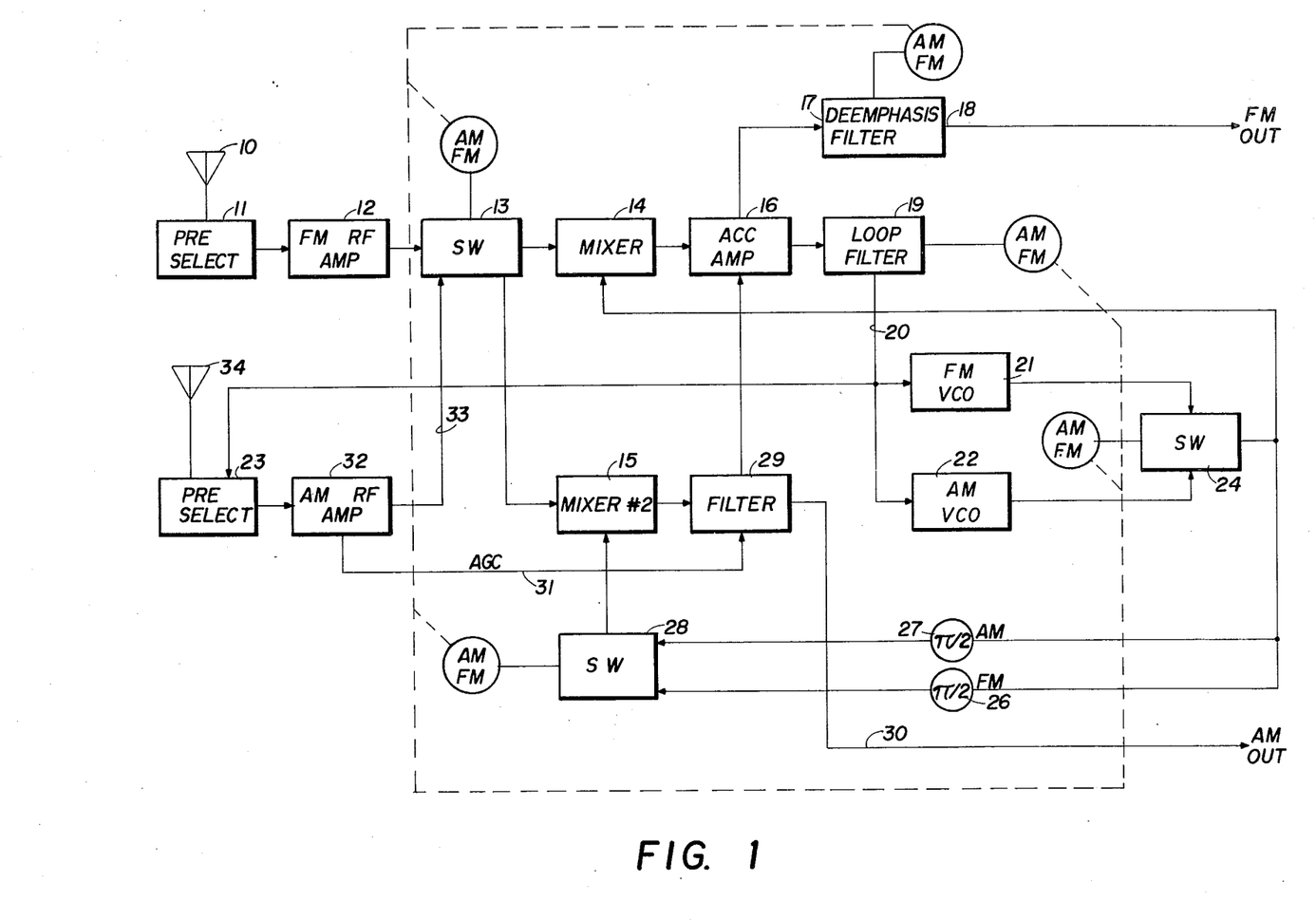
FIG. 1 is a block diagram of an embodiment of the present invention wherein an AM/FM receiver is provided.

Referring now to FIG. 1, an AM/FM tuner is illustrated in block form wherein an FM antenna 10 is connected to a pre-select unit 11 which applies signals from antenna 10 to an FM radio frequency amplifier 12. Amplifier 12 is preferably a low noise, high dynamic range amplifier. The output of amplifier 12 is connected by way of a switch 13 to the inputs of two mixers 14 and 15. The same signal is thus applied to mixers 14 and 15. The output of mixer 14 is connected to the input of an automatic gained controlled amplifier 16 whose signal output is connected by way of a deemphasis filter 17 to an output circuit 18 which leads to an audio amplifier channel (not shown) and thence to a transducer to produce output sound represented by the modulation of the signal from antenna 10.

The output of amplifier 16 is also connected to a loop filter 19. The filtered output from filter 19 is then applied by way of channel 20 to an FM oscillator 21 which is a voltage controlled oscillator. It is also connected to a second voltage controlled oscillator 22 which is used in the AM mode. It is also connected to a second pre-select filter 23.

The outputs of oscillators 21 and 22 are then connected by way of a selector switch 24 to mixers 14 and 15. The connection to mixer 14 is direct from the output of switch 24. Connections to the mixer 15 are by way of phase shifters 26 and 27 and selector switch 28. Phase shifters 26 and 27 serve to shift the phase of the output of the oscillator selected by switch 24 by a phase angle of 90° from the signal applied to mixer 14. The output of mixer 15 is then connected by way of filter 29 to the gain control terminal of amplifier 16. An output of filter 29 also appears on channel 30 as the AM output signal which is then connected through an audio amplifier to loud speaker systems.

An output of filter 29 is also connected by way of channel 31 as the usual automatic gain control signal for an AM amplifier 32. The output of amplifier 32 is connected by way of channel 33 to switch 13. The pre-select filter 23 is connected to receive signals from an antenna 34 and apply them to amplifier 32 and thence to switch 13.

In operation assume that an FM signal has been selected by the setting of switches 13, 24 and 28. The FM signal is filtered in the broad band pre-select filter 11 and amplified in the low noise, high dynamic range FM amplifier 12. This signal is then applied by way of switch 13 to the two high dynamic range mixers 14 and 15. The local oscillator signals for the mixers are of the same frequency as the incoming carrier but are shifted 90° one with respect to the other. The output of mixer 15 is filtered and supplies the automatic gain controlled bias voltage for the AGC amplifier 16. The output of mixer 14 is the base band signal applied to the input of the automatic gain controlled amplifier 16.

In the tracking mode, or when the phase lock loop has acquired lock, the output of mixer 14 is dependent on the amplitude and frequency changes of the input signal. In contrast, the output of mixer 15 is dependent on amplitude changes only. This is due to the quadrature relationship of the signals from oscillators 21 as applied directly to mixture 14 and through the phase change unit 26 to mixer 15. Any amplitude changes of the input signal are detected in mixer 15 and are supplied as AGC bias to the automatic gain controlled amplifier. Thus, there is produced a constant amplitude output signal from the automatic gain controlled amplifier 16 for an input signal whose amplitude changes.

The output of the automatic gain controlled amplifier 16 varies only when the input frequency is varied. This fact makes the system unique in that the signal leveling is accomplished inside of a phase lock loop comprised of mixer 14, automatic gain controlled amplifier 16, oscillator 21 where the output of oscillator 21 is fed back into mixer 14. The AGC action thus accomplished in amplifier 16 is inside of this feedback loop.

It is recognized that it is important that amplitude variations of the input signal do not affect the frequency of operation in the FM mode. The output of the automatic gain controlled amplifier 16 is the demodulated FM signal or PM before de-emphasis as accomplished in filter 17. the output when de-emphasized by filter 17 is the audio output signal on channel 18 to be amplified for application to output speakers. This output signal is also filtered in the loop filter 19 and applied as a bias to a varactor which controls the output frequency of oscillator 21. Modulation is at the same rate as the input FM signal and is applied to mixer 14 as well as to mixer 15, though in the latter case in quadrature phase relation.

In operation in the AM mode, switch 13 is actuated to apply the signal on channel 33 to mixers 14 and 15. The incoming signal has previously been filtered by the pre-select filter 23 and has been amplified in amplifier 32. The pre-select filter 23 is controlled by the same voltage, appearing on line 20, as controls the oscillator 21 and 22. In the AM mode, switch 24 is actuated to select the output of the AM oscillator 22. The switch 28 is actuated to apply the output of the AM phase shift unit 27 to mixer 15. Thus, the signal from pre-select filter 23 is connected to a high dynamic range AM amplifier 32 and is delivered to mixers 14 and 15. Mixers 14 and 15 function in the same manner as in the FM mode but with the local oscillator signal supplied by oscillator 22. The AM oscillator 22 is the same frequency as the input RF signal with mixer 14 output dependent on amplitude and frequency changes while mixer 15 output is dependent only on the amplitude change. The output of mixer 15 is then the demodulated AM signal supplied to an audio channel leading to an output speaker. Any variation or drift in input frequency is sensed by the AGC amplifier 16 and the oscillator 22 is corrected accordingly. The filtered output of mixer 15 is used to control the gain of amplifier 16.

Tuning the FM or AM system may be thus accomplished in any well known way to force the FM or AM oscillators 21 and 22 to be within the tracking range of the incoming signal. Such operations can be done manually or automatically. Once within the tracking ranges, the system may operate to receive FM broadcasts or AM broadcasts as selected by switches 13, 24 and 28 as above described.

Having described the system of FIG. 1 graphically to portray the present invention, reference will now be made to FIG. 2 in which the phase shift units are provided ahead of the mixers rather than in feedback relation from the oscillator. This permits elimination of some of the switching functions of FIG. 1.

Figure 2:
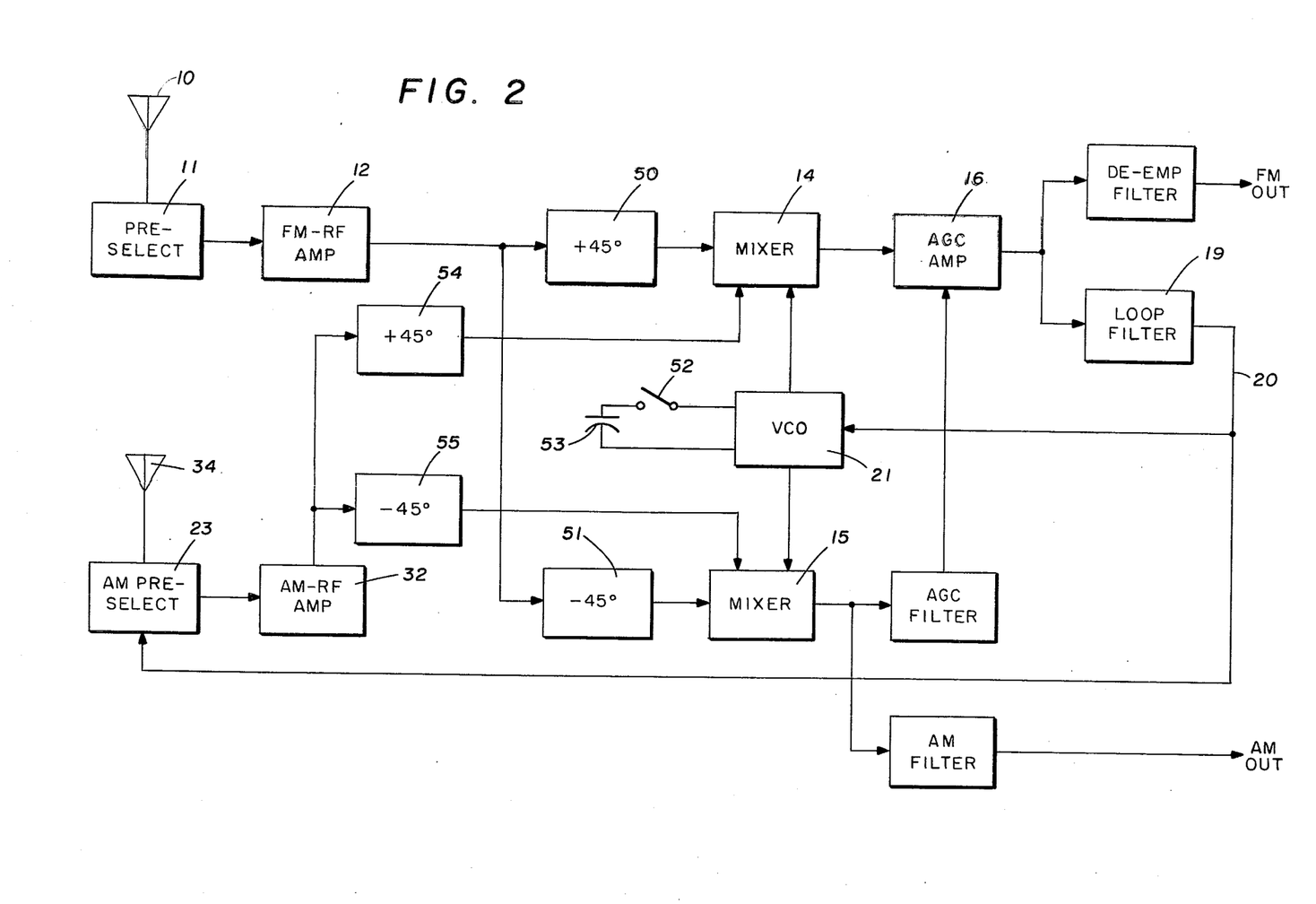
FIG. 2 is an alternate block diagram of the present invention wherein an AM/FM receiver is provided.

In FIG. 2, antenna 10, pre-select unit 11 and the RF amplifier 12 function as in FIG. 1. However, the output of amplifier 12 is connected by way of a phase shift unit 50 to a first mixer 14 and by way of a phase shift unit 51 to mixer 15. Mixer 14 feeds the signal out to the automatic gain controlled amplifier 16 whose output is then applied by way of loop filter 19 to a voltage controlled oscillator 21. The output of oscillator 21 is then fed directly to mixers 14 and 15.

In this embodiment, the phase shift units 50 and 51 introduce 45° phase shifts each, one being a lead unit and the other a lag unit so that the phase relation between the oscillator signal and the RF signal multiplied in mixer 14 is 90° from the phase relation between the oscillator signal and the RF signal multiplied in mixer 15.

A switch 52 is provided in the voltage controlled oscillator 21 through which a capacitor 53 may be connected into the voltage controlled oscillator circuit 21 to change the local oscillator frequency from the FM range to the AM range.

Further illustrated in FIG. 2 are components that are employed in connection with the operation in the AM range. In this embodiment, the antenna 34 feeds the pre-select unit 23 which in turn feeds the amplifier 32. The output of amplifier 32 is then supplied through phase shift units 54 and 55 mixers 14 and 15, respectively. The latter phase shift units are provided to supply voltages to mixers 14 and 15 which are 90° out of phase one with respect to the other. As in the circuit of FIG. 1, channel 20 is connected not only to the VCO oscillator 21, but to the pre-select unit 23 so that the filter in unit 23 will essentially track the frequency of the VCO 21 in the AM mode.

Figure 3:
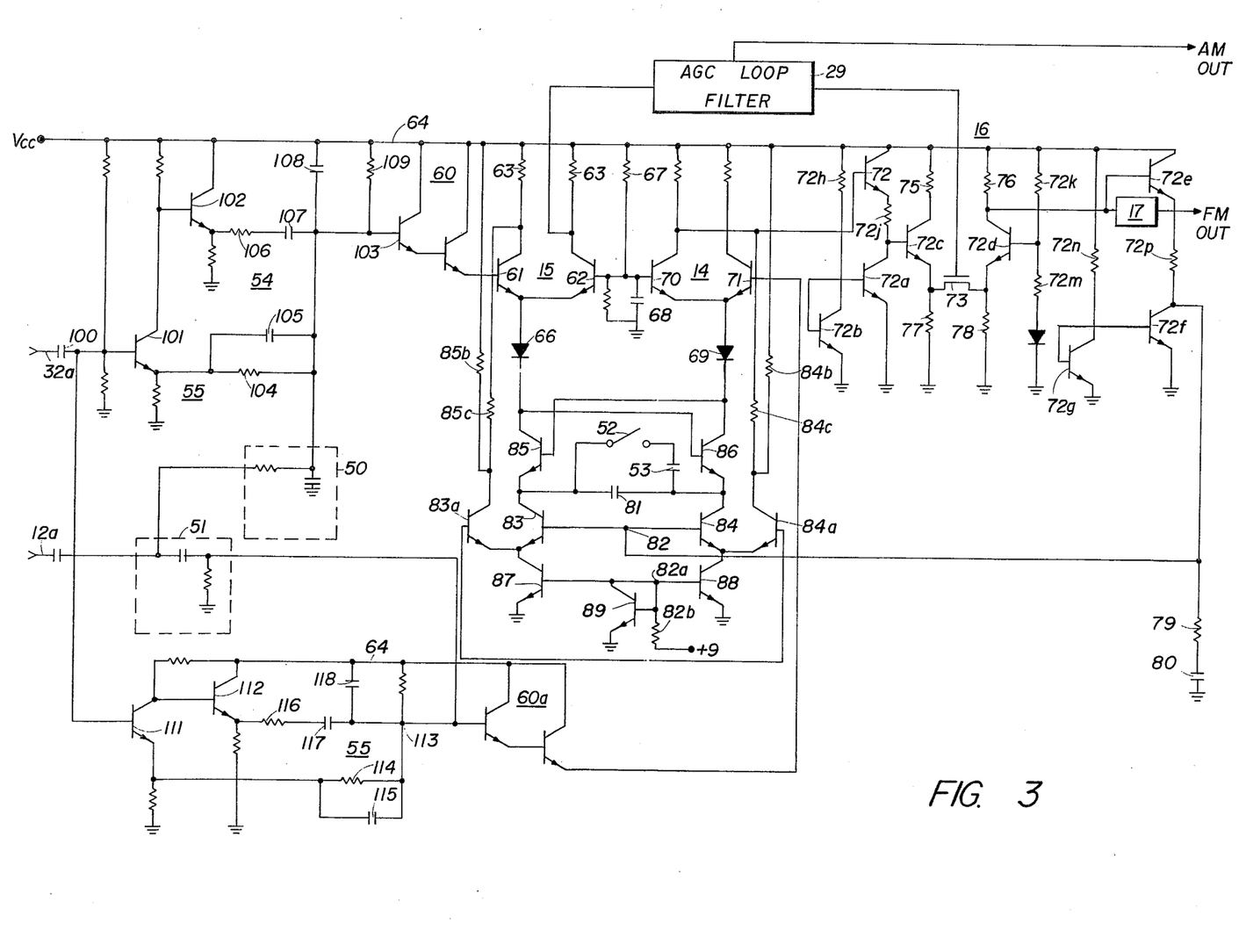
FIG. 3 is a detailed circuit diagram that implements a part of FIG. 2.

In FIG. 3, the system of FIG. 2 has been shown in discrete circuit form. The system shown in FIG. 3 may be readily executed in integrated circuit form in which form the invention finds its preferred embodiment.

In this system, the output from the amplifier 12 appears on channel 12a and is applied by way of phase shifter 50 comprising a series resistance and a shunt capacitor to the input of a Darlington pair 60. The output of the Darlington pair 60 is then connected to one input of a mixer 15. In a similar manner, the phase shifter 51 is connected through Darlington pair 60a to the input of mixer 14.

Mixer 15 is in the form of a differential amplifier comprised of transistors 61 and 62. The collectors are connected by way of resistors 63 to the $V_{cc}$ supply bus 64. The emitters are connected by way of diode 66 to one output of oscillator 21. The base of transistor 62 is connected by way of resistor 67 to $V_{cc}$ bus 64 and by way of RC circuit 68 to ground.

Mixer 14 is of construction identical to mixer 15. It is connected to the second output of oscillator 21 by way of diode 69. Transistor 70 is connected at its collector to the base of transistor 72 which is at the input of the automatic gain controlled amplifier 16.

Amplifier 16 comprises transistors 72c, 72d and FET 73. The collector of transistors 72c and 72d are connected by way of resistors 75 and 76, respectively, to $V_{cc}$ 64. The emitters are connected to the source and drain, respectively, of FET 73 and by way of resistors 77 and 78, respectively, to ground. The gate on FET 73 is connected to the output of the AGC filter 29. The input to the AGC filter 29 is supplied from the collector of transistor 62. Transistors 72a and 72b together with their associated circuits are provided to accommodate a DC level change as between the output of mixer 14 and the input of the amplifier 16. In a similar manner, the transistors 72e, 72f and 72g provide for compensation of level change as between the output of transistor 72d and the input at point 82 of the oscillator 21.

The output of amplifier 16 is taken from the collector of transistor 72f which is connected by way of series resistor 79 and capacitor 80 to the control input for oscillator 21. By this means oscillator 21 is controlled in its frequency by the capacitor 81 and the voltage applied across RC 79-80 (loop filter 19) to terminal 82.

Oscillator 21 in this embodiment comprises transistors 83, 83a, 84, 84a, 85 and 86. Transistors 83 and 84 have their emitters connected to ground by ay of transistors 87 and 88, respectively. A common base terminal 82a is connected to ground by way of transistor 89 connected with base and collector common to terminal 82a. Terminal 82a is connected to the legway of resistor 82b. The collector of transistor 83 is connected to the emitter of transistor 85 whose collector is connected to diode 66 and the base of transistor 86. In a similar manner, the collector of transistor 84 is connected to the emitter of transistor 86 whose collector is connected to diode 69 and the base of transistor 85.

Transistor 83a has a common emitter connection to transistor 83 with the base connected to the base of transistor 84a which in turn has a common emitter connection to transistor 84. The collector of transistor 83a is connected to $V_{cc}$ by way of resistor 85b and to the collector of transistor 61 by way of resistor 85c. In a similar manner, the collector of transistor 84a is connected to $V_{cc}$ by way of resistor 84b and to the collector of transistor 71 by resistor 84c. Transistors 83a and 84a together with resistors 85b, 85c, 84b and 84c serve to compensate for DC level changes in mixers 14 and 15 when the oscillator 21 shifts state.

Capacitor 81 is connected across the collectors of transistors 83 and 84 and thus across the emitters of transistors 85 and 86. A switch 52 is connected in series with capacitor 53 so that capacitor 53 can be connected in parallel to capacitor 81.

Oscillator 21 as shown in an emitter coupled multivibrator which operates at a frequency controlled by the voltage at point 82 and depends upon the size of capacitor 81.

In the form shown, the system operates to produce at the output of a de-emphasis filter 17 the desired demodulated output corrsponding to the modulation on the receiver by the FM antenna 10.

In operating in the AM mode, the phase shift units 54 and 55 are more complex than the phase shift units 50 and 51 employed in the FM mode.

More particularly, the output of the AM RF amplifier 32 appears on channel 32a and is coupled into the phase shift circuits 54 and 55 by way of condenser 100. The first phase shift circuit 54 receives an input signal by way of an amplifier transistor 101 which feeds the base of the second transistor 102. The emitter of transistor 101 is connected to a filter output point 103 by way of resistor 104 connected in parallel with capacitor 105. The emitter of transistor 102 is connected by way of the resistor 106 and capacitor 107 to point 103. Thus, the parallel circuit 104,105 is connected essentially in parallel with the series circuit 106, 107. Capacitor 108 and resistor 109 are connected from $V_{cc}$ 64 to terminal 103. The phase shift accomplished in this circuit is controlled by the resistive components 104, 106 and 109 and the capacitive components 105, 107 and 108. The output is then applied by way of the Darlington pair 60 to the mixer 15.

In a similar manner, the second phase shift unit 55 is fed from capacitor 100 by way of amplifier transistors 111 and 112. The output terminal 113 receives a signal from the emitter of transistor 111 by way of resistor 114 which is connected in parallel with capacitor 115. The emitter of transistor 112 is connected by way of series resistor 116 and capacitor 117 to terminal 113. Capacitor 118 and resistor 119 are connected to $V_{cc}$ 64. The output terminal 113 is connected to the input of Darlington pair 68 for application to the input of mixer 14. The AGC amplifier 16 is inside the gain control loop and accomplishes signal leveling.

In the circuit of phase shift units 54 and 55, the circuits have identical topology. Further, resistors 104 and 114 are the same, resistors 106 and 116 are the same and resistors 109 and 119 are the same. However, the capacitors differ in size so that a 90° relative difference in phase is maintained in producing the outputs of the phase shift circuits 54 and 55. Typically, the following values may be employed.

| | |
|---|---|
| Resistors 104 and 114 | 8.2k ohms |
| Resistors 106 and 116 | 1.8k ohms |
| Resistors 109 and 119 | 2.2k ohms |
| Capacitor 105 | 12 picofarads |
| Capacitor 107 | 56 picofarads |
| Capacitor 108 | 47 picofarads |
| Capacitor 115 | 39 picofarads |
| Capacitor 117 | 180 picofarads |
| Capacitor 118 | 150 picofarads |

Because of the difference in size of capacitors in the two circuits, the phase shift, while not constant in the phase shift units 54 and 55, provides a constant difference in phase.

In discrete form, the other circuits of FIG. 3 were operated with the following values:

| | |
|---|---|
| Resistor 63 | 470 ohms |
| Resistor 67 | 3.9k ohms |
| RC 68 | 10k ohms |
| Resistor 72h | 33 ohms |
| Resistor 72j | 27k ohms |
| Resistor 72k | 47k ohms |
| Resistor 72m | 1k ohms |

-continued

| | |
|---|---|
| Resistor 72n | 3k ohms |
| Resistor 72p | 1.1 ohms |
| Resistor 75,76 | 5.1k ohms |
| Resistor 77,78 | 100 ohms |
| Resistor 79 | 1000 ohms |
| Resistors 83b, 84b | 2.4k ohms |
| Resistors 83c, 84c | 2.0k ohms |

In operation, suppose that FM has been selected by switching the manually actuated switch 52. The FM signal is filtered in the broad band pre-select filter 11 and amplified in a low noise, high dynamic range FM RF amplifier 12. This signal is applied to high dynamic range mixers 14 and 15. The same local oscillator 21 is utilized for the two mixers so that they operate at the same frequency as the incoming character carrier. The relative phase in the two mixers, however, is 90° with respect to one another. The output of mixer 15 is filtered in filter 29 and supplies the AGC bias voltage for the amplifier 16.

In the tracking mode, when the phase lock loop has acquired phase lock, the output of mixer 14 is sensitive to amplitude and frequency changes of the input signal whereas the output of mixer 15 is sensitive to amplitude changes only. This is because of the quadrature relationship of the signals in the two channels. Any amplitude changes of the input signal is detected in mixer 15 and supplied as the AGC bias to the AGC amplifier 16. The result is a change of amplitude in the output of the AGC amplifier 16 for RF input amplitude changes. This implies that the output of the automatic gain controlled amplifier is varied only when the input RF frequency is varied. This fact makes the techniques unique in that the signal leveling is accomplished inside the loop. It is important that amplitude variations of the input signal not affect the frequency of operation. The output of the automatic gain controlled amplifier 16 is in fact the demodulated FM signal before de-emphasis.

As is well-known, circuitry at the broadcast station for FM transmission generally provides for emphasis of the high modulation frequencies so that after demodulation of the receiver, the converse of the signal treatment utilized at the transmitting station is employed. This serves to de-emphasize the high frequencies relative to the low frequencies after demodulation. For this reason de-emphasis filter 17 is included. The output of the de-emphasis filter 17 is the audio output signal which may be utilized in the speaker channels. Thus the output of amplifier 16 is filtered in loop filter 19 and applied as a varactor bias for the FM VCO 21. The VCO 21 is frequency modulated at the same rate as the input FM signal and applied to mixer 14 and to mixer 15. Thus, the oscillator 21 is a tracking oscillator whose frequency varies to accommodate the input signal.

In the AM mode, the switch 52 is closed so that oscillator 21 of FIG. 3 operates at a frequency suitable for AM demodulation. The incoming AM signal is filtered by the preselector controlled by a varactor voltage which is used for control oscillator 21. The signal is then amplified and delivered to mixers 14 and 15. The mixers function the same as above described in the FM mode with the local oscillator 21 and the input phase shift circuits 54 and 55 serving to maintain the quadrature phase relationship. The local oscillator 21 has the same frequency as the input RF signal with mixer 14 sensitive to amplitude and frequency changes while mixer 15 is sensitive only to amplitude changes. The filtered output of mixer 15 is the demodulated AM signal which may be applied to a speaker channel. Any variation in the input frequency is sensed by the automatic gain controlled amplifier 16 and the local oscillators corrected accordingly. The filtered output of mixer 14 is used to control the AM RF amplifier as indicated in FIGS. 1 and 2.

The general theory, construction and operation of phase lock loops and the use of phase lock techniques is well known, the same being described in the work entitled "Phase Lock Techniques" by Floyd M. Gardner, John Wiley, 1966. The present invention utilizes the phase lock loop principle for the purpose of providing a unique system wherein signal leveling is accomplished inside the phase lock loop and which may operate to provide either AM or FM output.

It will be understood that where reference is made above to AM operations and EM operations, the frequency bands intended generally are those normally employed. The AM broadcast band is from 540 to 1600 kilocycles with stations generally allocated at 10 kHz intervals. FM commercial broadcasts involved are in the range of from 88.1 to 107.9 mHz with bands spaced at 200 kHz intervals.

Figure 4:
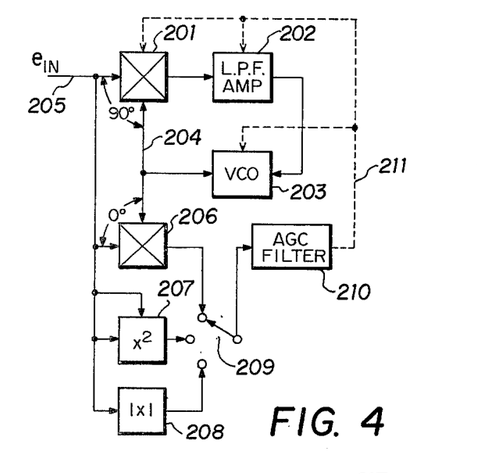
FIG. 4 illustrates in block form a generalized embodiment of the invention illustrating variables in selecting the source and use of the AGC voltage.

The example described above in connection with FIGS. 1–3 relates to AM/FM operations. It will be understood that the invention has other uses such as chroma demodulation in color TV sets. It is also useful in exponential modulation or AM modulation systems for subcarrier demodulation. Exponential modulated signals, involving phase shift keying and frequency shift keying, also can be demodulated in accordance with the present invention. FIG. 4 represents a generalized basic embodiment of the invention wherein mixer 201, low pass filter-amplifier 202 and a variable frequency oscillator 203 are connected in the form of a coherent demodulator loop. The output of the oscillator 203 is applied by way of channel 204 to one input of mixer 201. The gain in loop 201-204 may be controlled by a gain control voltage applied to any one of the mixer 201, filter-amplifier 202 and oscillator 203. The input signal to mixer 201 appearing on line 205 is in quadrature phase relation to the oscillator signal on line 204 and is in phase with the voltage applied to mixer 206. While not shown in FIG. 4, the phase shift may be introduced in the signal on channel 205 as in FIG. 1 or in channel 204 as exemplified in FIGS. 2 and 3.

The gain control voltage in any of several ways, three of which are shown in FIG. 4, may be generated from the signals out of units 206, 207 or 208. An output switch 209 is included to show the possibility of utilizing any one of the three gain control voltage generators 206, 207 or 208. Only one such generator would be used in any given system. Mixer 206 has the voltages on lines 204 and 205 as inputs. Multiplier 207 has the input signal on line 205 connected to both its inputs so that its output is the square of the signal on line 205. The unit 208 produces an output representative of the absolute value of the input in line 205.

The output from switch 209 is then connected by way of an AGC filter 210 to a selected one or more of the elements in the coherent demodulation loop 201–204. The connection may be any one of those indicated by the dotted line 211. Thus, the output of unit 206 is the in phase product of the input voltage and the oscillator voltage. The output of unit 207 is the squared value of the input voltage. The output unit 208 is the absolute value of the input voltage.

Figure 5:
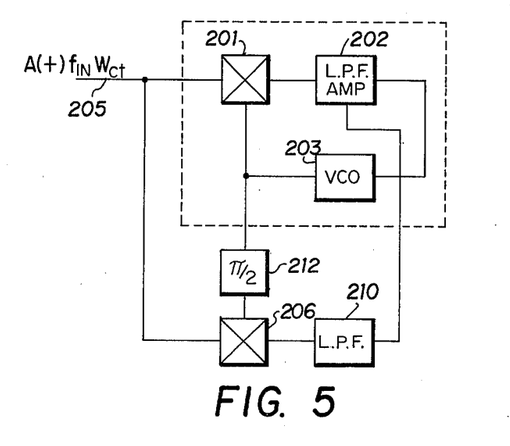
FIG. 5 is an emobidment generally as found in FIGS. 1 and 2.

In terms of the system shown in FIG. 1, the generalized arrangement shown in FIG. 4 is shown in FIG. 5. In this system, the input signal on line 205 is connected to mixer 201 which is in the coherent demodulator loop including elements 202 and 203. A phase shift unit 212 shifts the phase of the oscillator voltage 90° for application to mixer 206, the output which is applied by way of filter 210 as a gain control voltage to the unit 202.

Figure 6:
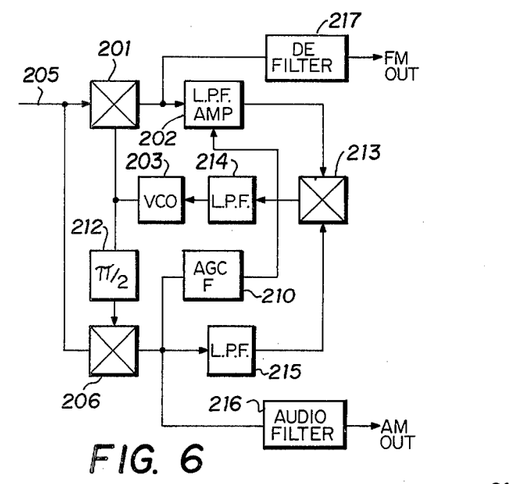
FIG. 6 is an embodiment of the invention applied to a circuit generally known as a costas loop.

FIG. 6 represents the application of the present invention to a coherent demodulator loop with AGC within the loop wherein side bands are tracked. In this system, the input signal on line 205 is applied to mixer 201 the output of which is applied to the filter 202. The output of filter 202 is then applied to a mixer 213 the output of which is applied by way of a low pass filter 214 to oscillator 203. The output of oscillator 203 is connected to mixer 201 and by way of phase shift device 212 to mixer 206. The output of mixer 206 is applied by way of filter 210 to the unit 202, and by way of a low pass filter 215 to the second input of mixer 213 for the development of the oscillator control voltage. The audio output of this system is then derived from the output of the mixer 206 by way of an audio frequency filter 216. The FM output of the system is derived at the output of mixer 201 by way of the de-emphasis filter 217.

Figure 7:
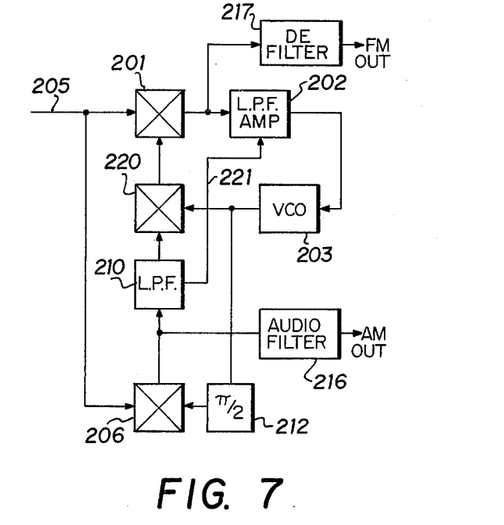
FIG. 7 illustrates a system in which the switching in unit 220 is in the digital mode.

FIG. 7 illustrates a substantial modification of the coherent demodulation loop embodiment of FIG. 6. In FIG. 7, the input signal on line 205 is applied to mixer 201 and thence to the loop including filter 202 whose output is employed to control the oscillator 203. The output of oscillator 203 is then applied to a mixer 220. The input on line 205 is also applied to a mixer 206 along with the phase shifted output of the oscillator 203. The latter signal is applied by way of the phase shift unit 212. The output of mixer 206 is applied by way of the low pass filter 210 whose output is then applied by way of channel 221 to filter 202. The output is also applied as the second input to mixer 220. Mixer 220 does not have to be an analog type of mixer but can be a digital Mod 2 adder which merely changes sign of the phase, i.e., may be a sign multiplier of the generally well known variety.

Figure 8:
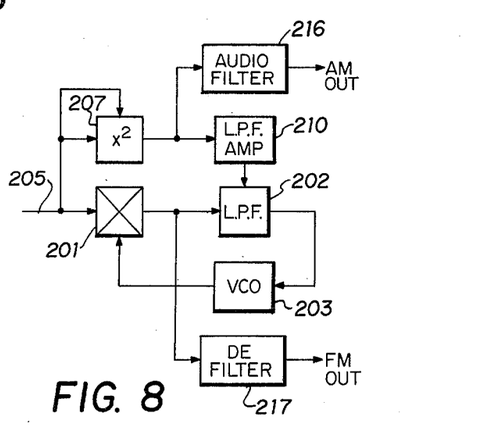
FIG. 8 illustrates a feed forward development of the AGC voltage employed in the loop.

FIG. 8 illustrates a further modification of the basic system of FIGS. 4 and 5. In this system, the signal on input channel 205 is applied to mixer 201 which is connected in the loop comprising filter 202 and oscillator 203. The phase lock loop then provides an output by way of the de-emphasis filter 217. The input signal on line 205 is also applied to both inputs of a multiplier 207 the output of which is applied to a low pass filter 210 whose output is then employed to control the gain of the filter 202. The audio output signals will be then derived from the output of the multiplier 207 by way of filter 216. Multiplier 207 can be replaced with an absolute value circuit or any asynchronous detector.

The systems of FIGS. 4–8 illustrate variations that may be employed. The preferred embodiment of the invention is illustrated in FIGS. 2 and 3. In each case, however, a coherent demodulator loop is employed for detection of a modulated input signal.

Each loop has a variable gain control capacity. Means in each case provide a gain control voltage dependent upon variations in amplitude of the input signal and apply the gain control voltage to a point within the loop to control the loop gain in accordance with the gain control voltage whereby the EM demodulated signal may be rendered independent of input carrier amplitude variations. In each case, a signal is readily available for acquisition of an AM output signal so that the system is uniquely suited for both EM operations and for AM/EM systems. The system as illustrated in FIGS. 2 and 3 can be executed in monolithic MOS configuration on a single chip semiconductor and thus lends itself to fabrication techniques of the latter type.

Exponential modulation as used herein refers to the generally understood meaning as set out in the work entitled "Reference Data For Radio Engineers" (ITT Handbook) Fifth Edition, 1968, Howard W. Sams & Company, page 21-6, Column 2. Demodulation of such signals is generally undertaken in coherent demodulation loops of which well known phase lock loops are representative. The present invention thus provides means for operating a coherent demodulation loop without requiring excess gain, maintaining the gain at a minimum by utilizing the variable gain conrol of an element within the coherent demodulator loop.

Having described the invention in connection with certain specific embodiments thereof, it is to be understood that further modifications may now suggest themselves to those skilled in the art and it is intended to cover such modifications as fall within the scope of the appended claims.

What is claimed is:
1. In a modulated signal processor, the combination comprising:
   a. a coherent demodulator loop for detection of a modulated signal including mixer meams, amplifier means and voltage controlled oscillator means at least one of said means having a variable gain control capability,
   b. generator means to generate the amplitude modulation signal of a modulated input signal,
   c. means to apply said modulated input signal to said demodulator loop and to said generator, and
   d. means to apply said amplitude modulation signal as the gain control voltage to said means having variable gain control capability within said loop to control the gain of said loop in accordance with said amplitude modulation signal.
2. The combination set forth in claim 1 further comprising means for extracting the angle modulation signal of said modulated input signal from a selected point within said loop.
3. The combination as defined in claim 1 wherein said means to generate the amplitude modulation signal of said modulated input signal is a coherent detector.
4. The combination as defined in claim 3 wherein said coherent detector comprises a mixer receiving at one input the output signal of said voltage controlled oscillator means and at another input the received modulated signal.
5. The combination as defined in claim 1 wherein said modulated signal frequency is within the AM broadcast band and said processor further contains output means to receive the output of said generator and produce audio signals.
6. The combination as defined in claim 5 further comprising variable gain amplifier means connected to amplify said received modulated signal before application to said demodulator loop and means to derive from said means to generate the amplitude modulation signal subaudio frequencies of said amplitude modulation signal and to apply said subaudio frequencies as the gain control signal to said amplifier means.

7. The combination as defined in claim 1 wherein said modulated signal frequency is within the FM band and said processor further comprises means to receive the output of said at least one variable gain element and produced therefrom an audio signal.

8. The combination as defined in claim 1 further comprising a variable tuned preselect means to receive said modulated signal and apply said modulated signal to said mixers and said preselect means is tuned by a signal derived from coherent demodulator loop.

9. An AM-FM tuner-demodulator which may be executed as a monolithic semiconductor circuit structure which comprises:
   a. a pair of mixers to which a received modulated signal is applied,
   b. a signal controlled variable gain amplifier to receive the output of the first of said mixers,
   c. a signal controlled variable frequency oscillator connected to receive the output of said amplifier whereby said oscillator frequency is caused to track the frequency of said received modulated signal,
   d. means applying the output of said oscillator to both of said mixers in phase relationship to said received modulated signal whereby the output of said first mixer is the AM and FM modulation signal of said received signal and the output of the second of said mixers is the amplitude modulation signal only of said received signal,
   e. means for applying the output from the second of said mixers as the gain control signal of said variable gain amplifier, and
   f. filter means to receive signals from one of said amplifier, said voltage controlled oscillator and said first mixer to provide FM demodulation output signals, and filter means to receive the output from said second mixer to provide AM demodulation output signals.

10. In the demodulation of an angle modulated signal, the method of:
   a. applying said angle modulated signal to a coherent demodulator loop,
   b. generating from said angle modulated signal the amplitude modulated signal component thereof,
   c. applying said amplitude modulated signal component to a variable gain element of said loop as the gain control signal therefor to level the signal amplitude within said loop, and
   d. extracting the angle modulation signal of said modulated signal from a selected point within said loop.

* * * * *